US006683817B2

United States Patent
Wei et al.

(12)

(10) Patent No.: US 6,683,817 B2
(45) Date of Patent: Jan. 27, 2004

(54) DIRECT MEMORY SWAPPING BETWEEN NAND FLASH AND SRAM WITH ERROR CORRECTION CODING

(75) Inventors: Jian Wei, San Diego, CA (US); Inyup Kang, San Diego, CA (US); Julio Arceo, San Diego, CA (US); Jalal Husseini, San Diego, CA (US); Tao Li, San Diego, CA (US); Bruce Meagher, San Diego, CA (US); Richard Higgins, San Diego, CA (US); Moto Oishi, San Diego, CA (US); Brian Rodrigues, San Diego, CA (US)

(73) Assignee: QUALCOMM, Incorporated, San Diego, CA (US)

( * ) Notice: Subject to any disclaimer, the term of this patent is extended or adjusted under 35 U.S.C. 154(b) by 92 days.

(21) Appl. No.: 10/081,503

(22) Filed: Feb. 21, 2002

(65) Prior Publication Data

US 2003/0156454 A1 Aug. 21, 2003

(51) Int. Cl.$^7$ .................................................. G11C 7/00
(52) U.S. Cl. .............. 365/230.03; 365/235; 365/185.11
(58) Field of Search .......................... 365/230.03, 235, 365/238.5, 185.11, 185.12, 185.33

(56) References Cited

U.S. PATENT DOCUMENTS

| | | | | |
|---|---|---|---|---|
| 4,965,828 A | | 10/1990 | Ergott, Jr. et al. | |
| 5,550,489 A | * | 8/1996 | Raab | 326/93 |
| 5,588,112 A | * | 12/1996 | Dearth et al. | 714/9 |
| 5,606,532 A | | 2/1997 | Lambrache et al. | |
| 5,721,739 A | | 2/1998 | Lyle | |
| 5,754,469 A | | 5/1998 | Hung et al. | |

* cited by examiner

Primary Examiner—Vu A. Le
(74) Attorney, Agent, or Firm—Philip R. Wadsworth; Charles D. Brown; George C. Pappas

(57) ABSTRACT

Memory architectures and techniques that support direct memory swapping between NAND Flash and SRAM with error correction coding (ECC). In a specific design, a memory architecture includes a first storage unit (e.g., an SRAM) operative to provide storage of data, a second storage unit (e.g., a NAND Flash) operative to provide (mass) storage of data, an EMI unit implemented within an ASIC and operative to provide control signals for the storage units, and a data bus coupled to both storage units and the EMI unit. The two storage units are implemented external to the ASIC, and each storage unit is operable to store data from the other storage unit via the data bus when the other storage unit is being accessed by the EMI unit. The EMI unit may include an ECC unit operative to perform block coding of data transferred to/from the second storage unit.

18 Claims, 8 Drawing Sheets

DIRECT MEMORY SWAPPING BETWEEN NAND FLASH AND SRAM WITH ERROR CORRECTION CODING

BACKGROUND

1. Field

The present invention relates generally to electronics circuits, and more specifically to memory architectures and techniques that support direct memory swapping between NAND Flash and SRAM with error correction coding.

2. Background

Newer generation wireless communication devices (e.g., terminals, handsets, and cellular phones) are capable of providing various types of communication such as voice and packet data. Some of these devices may also be designed with enhanced functionality, and may further be operated as a personal digital assistant (PDA), a Web terminal, a computing device, and so on. Newer designs for these devices need to provide all the required functions and features while at the same time conforming to other design constraints such as reduced size, cost, and power consumption.

As wireless communication devices become more complex and are required to provide more functions and features, more computing power and larger memories are inevitably required. A large memory is typically needed to provide storage for data and program codes used to support voice and/or data communication and other functions and features. Various types of memory may be used for these devices, including static random access memory (SRAM), dynamic RAM (DRAM), and Flash.

SRAM and DRAM are volatile memories that lose the data stored therein once power is removed. SRAM and DRAM can be accessed in a random manner, which is the manner most processors are programmed to access memory for data and codes. Consequently, SRAM or DRAM is commonly used as the main run-time storage unit in many wireless communication devices.

Flash is a non-volatile memory that can retain the data stored therein even after power is removed. NAND Flash, which is one type of Flash, is a high-density design and has certain advantages over other types of memory, including a large storage capacity (e.g., one giga-bits or more), good speed for continued access, and low cost. However, NAND Flash also has several inherent drawbacks, including poor performance for random access and increased susceptibility to bit errors over the NAND Flash's operating lifetime. In particular, NAND Flash is typically accessed in unit of pages, one page at a time, with each page being of a particular size (e.g., 512 bytes).

As the cost of memories in communication devices becomes more prohibitive, NAND Flash is a good candidate for use as the mass storage unit for these devices. However, because the structure of NAND Flash is not suitable for random access, program codes cannot be executed directly from the NAND Flash. Instead, SRAM may be used as an intermediate storage for data and program codes that need to be accessed in a random manner by the processor. A memory architecture that incorporates both SRAM and NAND Flash may thus provide large storage capacity, reduced cost, and random access.

Conventionally, reading data from or writing data into NAND Flash requires excessive involvement and control by the processor. This can tie up the processor and prevents it from performing other functions, which can then result in overall performance degradation for the communication device. Moreover, since NAND Flash is more prone to bit errors, a mechanism is needed to ensure data integrity when loading data from or into the NAND Flash.

There is therefore a need in the art for memory architectures and techniques that can provide improved data transfer for the NAND Flash and which can furthermore ensure data integrity.

SUMMARY

In an embodiment, a memory architecture is provided for use in a wireless communication device (e.g., a terminal, a cellular phone, and so on). The memory architecture includes (1) a first storage unit (e.g., an SRAM) operative to provide storage of data, (2) a second storage unit (e.g., a NAND Flash) operative to provide (mass) storage of data, (3) an EMI unit implemented within an ASIC and operative to provide control signals for the two storage units, and (4) a data bus coupled to the first and second storage units and to the EMI unit. The first and second storage units are implemented external to the ASIC, and each storage unit is operable to store data from the other storage unit via the data bus when the other storage unit is being accessed by the EMI unit. The EMI unit may include an ECC unit operative to perform block coding of data retrieved from or stored to the second (NAND Flash) storage unit. The EMI unit may further include an address generator operative to provide addresses for data retrieved from or stored to the first (SRAM) storage unit.

Another embodiment provides a memory system for a wireless communication device. The memory system comprises (1) an SRAM storage unit operative to provide storage of data, (2) a NAND Flash storage unit operative to provide additional storage of data, (3) an interface unit implemented within an ASIC and operative to provide control signals for the SRAM and NAND Flash storage units, and (4) a data bus coupled to the SRAM and NAND Flash storage units and the interface unit. The SRAM and NAND Flash storage units are implemented external to the ASIC, and each storage unit is operable to concurrently store data from the other storage unit via the data bus when the other storage unit is accessed by the interface unit.

Yet another embodiment provides a wireless communication device comprising (1) an external memory unit including an SRAM storage unit and a NAND Flash storage unit, (2) an ASIC including an interface unit operative to provide control signals for the SRAM and NAND Flash storage units, and (3) a data bus coupled to the SRAM and NAND Flash storage units and the interface unit. The SRAM and NAND Flash storage units are each operable to concurrently store data from the other storage unit via the data bus when the other storage unit is accessed by the interface unit.

Yet another embodiment provides a method for transferring data between two storage units in a wireless communication device. Initially, a start address for an SRAM storage unit and a page address for a NAND Flash storage unit are received. Control signals are then provided for the SRAM and NAND Flash storage units in response to receiving a start command. Data is then retrieved from a "source" storage unit, which is either the SRAM or NAND Flash storage unit, via a data bus. The retrieved data is written to a "destination" storage unit, which is the other storage unit, via the data bus concurrently with the reading of the data from the source storage unit.

Various aspects and embodiments of the invention are described in further detail below. The invention further provides memory architectures, receiver units, wireless communication devices, methods, and other apparatuses and elements that implement various aspects, embodiments, and features of the invention, as described in further detail below.

BRIEF DESCRIPTION OF THE DRAWINGS

The features, nature, and advantages of the present invention will become more apparent from the detailed description set forth below when taken in conjunction with the drawings in which like reference characters identify correspondingly throughout and wherein.

DETAILED DESCRIPTION

Memory architectures and techniques are provided herein that are capable of supporting direct memory swapping between NAND Flash and SRAM with error correction coding (ECC). In one design, a single data bus is provided for both the SRAM and NAND Flash and further interconnects these two storage units to an application specific integrated circuit (ASIC) for which the data stored in these storage units is used. The single data bus design allows the data being retrieved from one storage unit (the SRAM or NAND Flash) to be simultaneously written to the other storage unit.

An external memory interface (EMI) unit within the ASIC provides various control signals needed to effectuate transfer of data between the SRAM and NAND Flash. These control signals may be automatically generated by the EMI unit based on (1) a page address for the NAND Flash, (2) a start address for the SRAM, and (3) a start command. This then relieves the unit requesting the data transfer from having to supervise the actual data transfer between the two storage units. Since the SRAM and NAND Flash may be operated to perform complementary functions (read and write) at any given time, the write enable (WE_n) and the read enable (RE_n) for the SRAM may be effectively swapped with the WE_n and RE_n for the NAND Flash, as described below.

An ECC unit is also provided within the EMI unit to perform error correction coding for each page of data being transferred. In particular, the ECC unit block encodes each page of data written to the NAND Flash, and detects and corrects errors in each page of data read from the NAND Flash.

Figure 1:
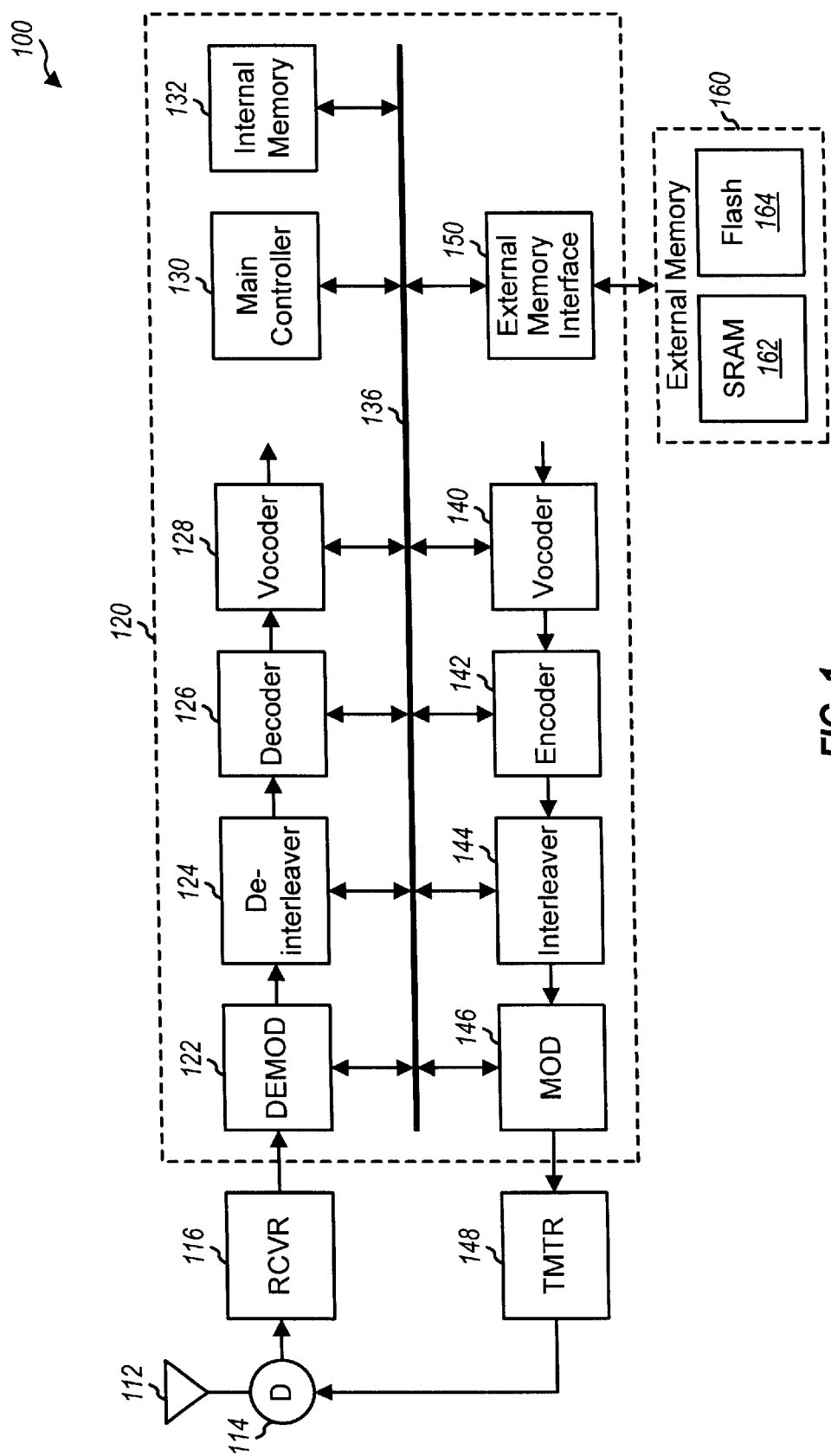
FIG. 1 is a block diagram of a specific embodiment of a wireless communication device.

FIG. 1 is a block diagram of a specific embodiment of a wireless communication device 100 wherein various aspects and embodiments of the invention may be implemented. Wireless communication device 100 may be a terminal, a cellular phone, a handset, a modem, or some other devices or designs. In the embodiment shown in FIG. 1, device 100 is capable of providing bi-directional communication via a receive path and a transmit path.

For the receive path, one or more transmitted signals are received by an antenna 112, routed through a duplexer (D) 114, and provided to a receiver (RCVR) 116. Receiver 116 conditions (e.g., filters, amplifies, and downconverts) the received signal and digitizes the conditioned signal to provide data samples. The data samples are then provided to an application specific integrated circuit (ASIC) 120 for further processing.

Within ASIC 120, a demodulator (DEMOD) 122 receives and processes the data samples to provide demodulated data. For a CDMA system, the processing by demodulator 122 may include (1) resampling the data samples with the proper sample timing, (2) despreading the resampled data with a pseudo-random noise (PN) sequence or a descrambling code, (3) decovering the despread data with a channelization code (e.g., a Walsh code or an OVSF code), and (4) data demodulating the decovered data with a recovered pilot to provide the demodulated data.

A deinterleaver 124 then deinterleaves the demodulated data in accordance with a deinterleaving scheme that is complementary to the interleaving scheme used at the transmitter system. A decoder 126 then decodes each deinterleaved data frame or packet in accordance with a decoding scheme that is complementary to the coding scheme used at the transmitted system. For example, Viterbi, Turbo, and/or block decoding may be performed if convolutional, Turbo, and/or block coding, respectively, is performed at the transmitter system. The decoded data may further be checked for frame error based on a cyclic redundancy check (CRC) code, which is commonly used in CDMA systems.

For a data communication, the decoded data may be provided to a main controller 130 and/or stored to a storage unit (e.g., an internal memory 132 and/or an external memory 160). And for a voice communication, a vocoder 128 decompresses the decoded data to provide speech data. Additional circuitry (not shown in FIG. 1 for simplicity) then conditions the speech data to provide a speech signal suitable for an output device (e.g., a speaker).

For the transmit path, data to be transmitted from wireless communication device 100 is provided to an encoder 142 for processing. For a data communication, the input data for encoder 142 may be provided by main controller 130 and/or a storage unit (e.g., internal memory 132 and/or external memory 160). And for a voice communication, a speech signal received via an input device (e.g., a microphone) may be conditioned and digitized by pre-conditioning circuitry (not shown in FIG. 1 for simplicity) to provide speech data. A vocoder 140 then compresses the speech data to provide the input data for encoder 142.

Encoder 142 codes the received data in accordance with a particular coding scheme, which may including any combination of CRC, convolutional, Turbo, and/or block coding. The coded data is then interleaved in accordance with a particular interleaving scheme by an interleaver 144, and the interleaved data is further processed by a modulator (MOD) 146. For a CDMA system, the processing by modulator 146 may include covering the data with a channelization code and spreading the covered data with a PN sequence or a scrambling code. The modulated data is then conditioned (e.g., filtered, amplified, and upconverted) by a transmitter (TMTR) 148 to provide a modulated signal, which is then routed through duplexer 114 and transmitted via antenna 112.

Main controller 130 may perform various processing functions for voice/data communication and may also be used to direct the operation of various processing units within ASIC 120 and wireless communication device 100. Main controller 130 may be implemented based on various designs such as a reduced instruction set computing (RISC) processor, a complex instruction set computing (CISC) processor, and so on.

In the specific embodiment shown in FIG. 1, a system bus 136 interconnects various processing units within ASIC 120. Internal memory 132 (i.e., "internal" to ASIC 120) may be used to store data and program codes needed by various processing units within ASIC 120. External memory 160 may be used to provide a larger storage area for data and program codes needed by various processing units within ASIC 120, including main controller 130. An external memory interface (EMI) unit 150 provides the interface between external memory 160 and other processing units within ASIC 120 via system bus 136.

Wireless communication device 100 may be designed to provide various functions and features, some or all of which may be provided by the various processing units within ASIC 120. Device 100 may also include other ASICs, processors, and integrated circuit (IC) chips designed to provide other functionality (e.g., PDA functions, Web functions, and so on). ASIC 120 may then be designed to communicate with these other ASICs and chips via some other interface units and/or I/O signals and buses, which are not shown in FIG. 1 for simplicity.

In the embodiment shown in FIG. 1, several storage units are provided within wireless communication device 100 to store data and program codes needed to provide the required functions and features. These storage units include internal memory 132 and external memory 160. In general, internal memory 132 is a faster memory that can be used to store data and program codes needed to be accessed quickly, such as data and codes used for real-time processing of a voice or data call. However, due to size and cost considerations, internal memory 132 is typically relatively small in size and has insufficient capacity to store all of the required data and codes. Internal memory 132 may be implemented with static random access memory (SRAM), Flash, and/or some other types of memory.

External memory 160 is implemented external to ASIC 120 and provides additional (mass) storage for the processing units within the ASIC. In an embodiment, external memory 160 comprises an SRAM 162 and a Flash 164 that may be implemented on one or more silicon dies and may further be packaged in one or more IC packages. External memory 160 may be a commercially available product or may be implemented as a custom IC. External memory 160 stores data and program codes that can tolerate longer access time, such as data for use with non-real-time functions and/or data to be transferred to/from internal memory 132. External memory 160 interfaces with ASIC 120 via external memory interface unit 150. For simplicity, data and program codes are collectively referred to as just "data" in the subsequent description.

Figure 2A:
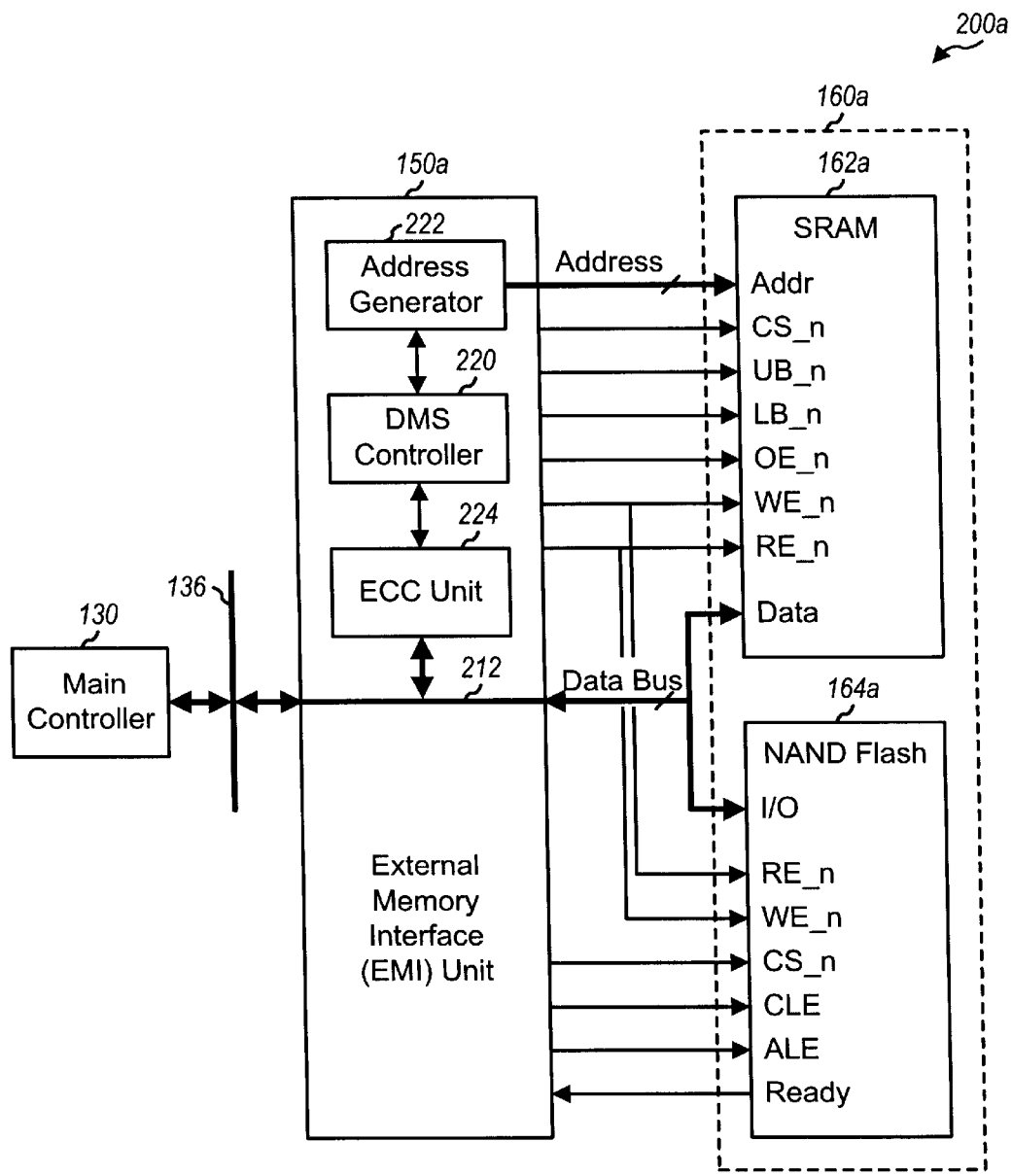
FIGS. 2A, 2B, and 2C are block diagrams of three embodiments of a memory architecture that supports direct memory swapping between a NAND Flash and an SRAM with error correction coding (ECC)

FIG. 2A is a block diagram of an embodiment of a memory architecture 200a that supports direct memory swapping between a NAND Flash and an SRAM with error correction coding (ECC). Memory architecture 200a comprises an external memory interface (EMI) unit 150a coupled to an SRAM 162a and a NAND Flash 164a. EMI unit 150a is one embodiment of EMI unit 150 in FIG. 1, and SRAM 162a and NAND Flash 164a are one embodiment of SRAM 162 and Flash 164 within external memory 160 in FIG. 1. Other types of volatile memory may also be used for SRAM 162a such as, for example, asynchronous SRAMs, asynchronous page read SRAMs, pseudo-SRAMs, DRAMs, pseudo-RAMs (non-page and paged), SDRAM, burst-RAMs, and so on. There are at least two types of For pseudo-RAMs: (1) those whose interface resembles an asynchronous SRAM and (1) those requiring toggling of the CS/WR__n/RD__n pins between transfers. Both types of pseudo-RAMs may be supported by a memory controller with the proper interface to the pseudo-RAMs. The SDRAM and burst-RAMs may be supported by a memory controller having the required logic to do the NAND to SRAM data transfer. Other types of non-volatile memory may also be used for NAND Flash 164a, and this is within the scope of the invention.

As shown in FIG. 2A, a single data bus 212 couples to both SRAM 162a and NAND Flash 164a and further interconnects these two storage units to system bus 136 of ASIC 120. Data bus 212 may be designed with any width (e.g., 8-bit, 16-bit, and so on), which is typically dependent on the input/output (I/O) size of SRAM 162a and NAND Flash 164a. Multi-byte data I/O may be supported, for example, by properly controlling the UB_n and LB_n signals for the SRAM.

EMI unit 150a provides various control signals for SRAM 162a and NAND Flash 164a. In an embodiment, EMI unit 150a includes a direct memory swapping (DMS) controller 220, an address generator 222, and an error correction coding (ECC) unit 224.

In an embodiment, Table 1 lists the control signals provided by DMS controller 220 to SRAM 162a.

TABLE 1

| Signal Name | Function |
|---|---|
| CS_n | chip select | enables the operation of the SRAM, where "_n" denotes an active low signal |
| UB_n | | selects the upper half of the data bus output (e.g., the upper 8 bits of a 16-bit data bus) |
| LB_n | | selects the lower half of the data bus output |
| OE_n | output enable | enables the data output buffers of the SRAM |
| WE_n | write enable | controls the writing of data to the Data port of the SRAM |
| RE_n | read enable | controls the reading of data from the Data port of the SRAM |

Address generator 222, under the direction of DMS controller 220, provides the addresses for SRAM 162a.

In an embodiment, Table 2 lists the control signals provided by DMS controller 220 to NAND Flash 164a.

TABLE 2

| Signal Name | Function |
|---|---|
| CS_n | chip select | enables the operation of the NAND Flash |
| CLE | command latch enable | controls the loading of commands into an internal command register within the NAND Flash |
| ALE | address latch enable | controls the loading of either address information or input data into an internal address/data register within the NAND Flash |
| WE_n | write enable | controls the writing of data to the I/O port of the NAND Flash |
| RE_n | read enable | controls the reading of data from the I/O port of the NAND Flash |

DMS controller 220 also receives a Ready signal from NAND Flash 164a that indicates whether the NAND Flash is busy (logic low) or ready (logic high). When the NAND Flash is busy, as indicated by the Ready signal being at logic low, control signals are not provided to the NAND Flash.

Detailed description of the control signals listed in Tables 1 and 2 may be obtained from data sheets for commercially available NAND Flash and SRAM devices.

As shown in FIG. 2A, a single control signal is provided to both the WE_n pin of SRAM 162a and the RE_n pin of NAND Flash 164a, and another single control signal is provided to both the RE_n pin of SRAM 162a and the WE_n pin of NAND Flash 164a. The WE_n and RE_n signals for SRAM 162a and NAND Flash 164a are thus effectively switched.

Figure 2B:
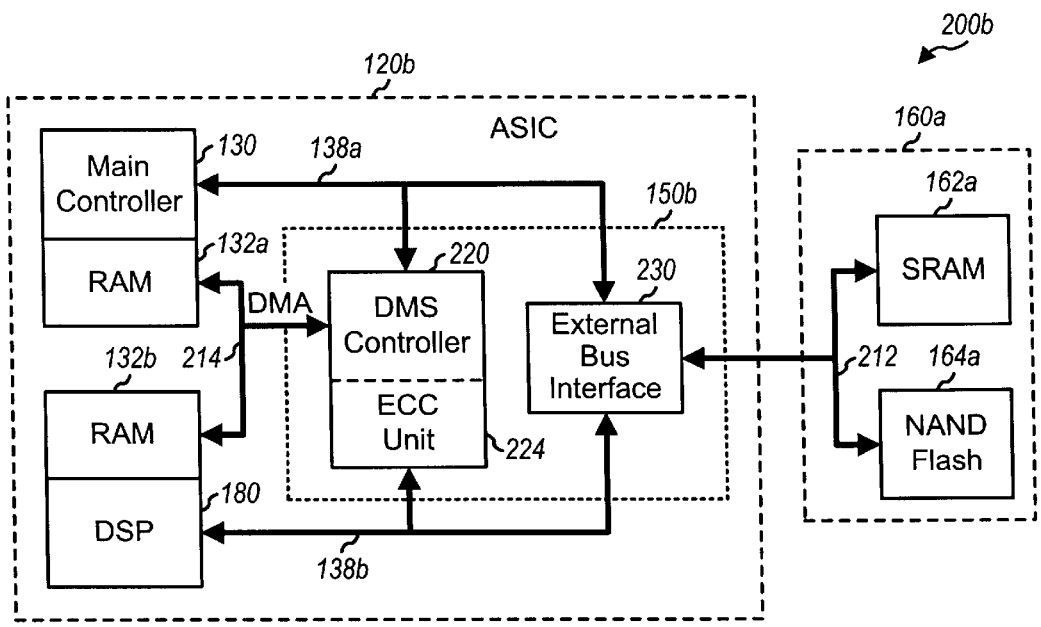

FIG. 2B is a block diagram of an embodiment of a memory architecture 200b that also supports direct memory swapping between the NAND Flash and SRAM with error correction coding. In this embodiment, within ASIC 120b (which is one embodiment of ASIC 120 in FIG. 1), main controller 130 is associated with a dedicated RAM 132a and a digital signal processor (DSP) 180 is also associated with a dedicated RAM 132b. DSP 180 may be used to implement various processing units within ASIC 120, such as demodulator 122, decoder 126, encoder 142, modulator 146, and so on. RAMs 132a and 132b may be part of internal memory 132 in FIG. 1.

Main controller 130 and DSP 180 interface with an EMI unit 150b (which is another embodiment of EMI unit 150 in FIG. 1). In particular, main controller 130 interfaces with DMS controller 220 and an external bus interface (EBI) unit 230 via a bus 138a, and DSP 180 interfaces with DMS controller 220 and EBI unit 230 via a bus 138b. RAMs 132a and 132b interface directly with each other and with DMS controller 220 via a direct memory access (DMA) bus 214. DMS controller 220 includes ECC unit 224, which is used to provide error correction functions for data transfers on buses 138a and 138b.

Memory architecture 200b allows data from SRAM 162a and NAND Flash 164a to be provided more directly to main controller 130 and DSP 180 via EBI unit 230.

Figure 2C:
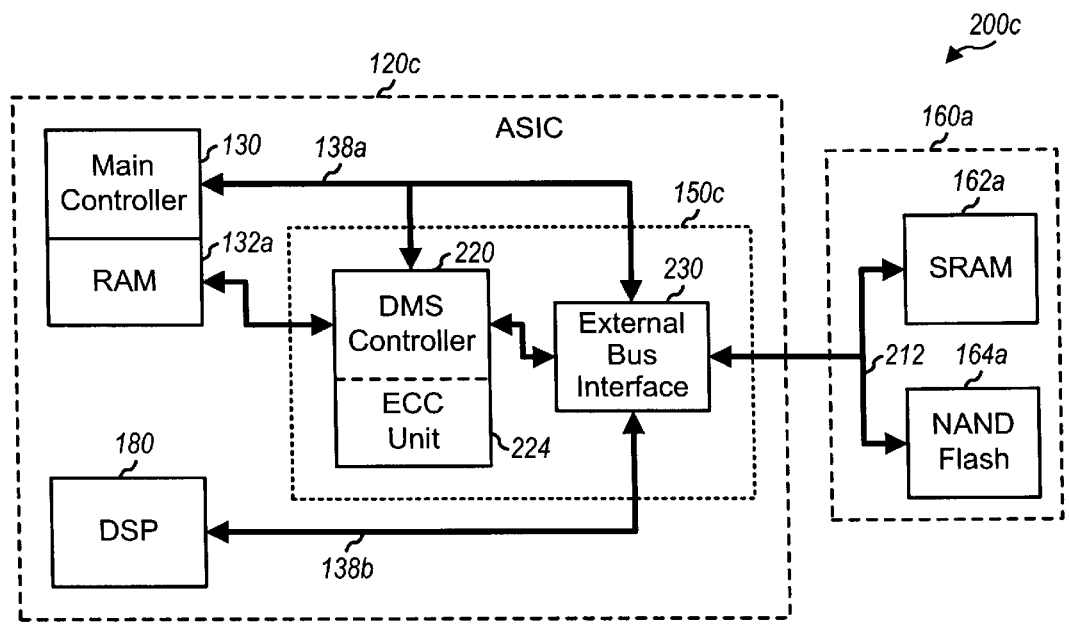

FIG. 2C is a block diagram of an embodiment of a memory architecture 200c that also supports direct memory swapping between the NAND Flash and SRAM with error correction coding. In this embodiment, within ASIC 120c (which is another embodiment of ASIC 120 in FIG. 1), main controller 130 is associated with dedicated RAM 132a but DSP 180 is not associated with a dedicated RAM.

Main controller 130 and DSP 180 interface with an EMI unit 150c (which is yet another embodiment of EMI unit 150 in FIG. 1). In particular, main controller 130 interfaces with DMS controller 220 and EBI unit 230, and DSP 180 interfaces with EBI unit 230. RAM 132a interfaces directly with DMS controller 220, which further interfaces with EBI unit 230. DMS controller 220 includes ECC unit 224, which is used to provide error correction functions for data transfers on buses 138a and 138b.

Memory architecture 200c allows data from SRAM 162a and NAND Flash 164a to be provided more directly to DSP 180 via EBI unit 230, and further allows data to be transferred between RAM 132a and the external storage units. In certain designs, an ASIC may include a single main controller and multiple DSPs. Memory architecture 200c may then allow each DSP to more readily access the data stored in the SRAM and NAND Flash.

Memory structures 200b and 200c provide an efficient mechanism for transferring data between SRAM 162a and NAND Flash 164a. The NAND flash may be used as a mass nonvolatile storage for a terminal (e.g., a mobile device), similar to a hard disk for a personal computer (PC), and may store the bulk of the data for the terminal. The SRAM may be used to store data to be processed. Memory structures 200b and 200c offer a high bandwidth data transfer between the NAND Flash and the SRAM (analogous to the data transfer between a PC hard disk and a PC memory). Moreover, the data transfer between the NAND Flash and SRAM may be performed in the background without involvement from the processor, which may then allow the processor to perform other task concurrently with the data transfer.

Memory architectures 200a, 200b, and 200c support several operating modes, including a normal mode, a "Flash-to-SRAM" mode, and an "SRAM-to-Flash" mode. For the normal mode, data may be written to or read from SRAM 162a in the normal manner, and NAND Flash 164a is disabled (by providing a logic high on the CS_n pin of the NAND Flash). In the normal made, the memory interface between ASIC 120 and SRAM 162a is as if NAND Flash 164a is not present. In the Flash-to-SRAM mode, data is read from NAND Flash 164a via data bus 212 and, at the same time, the retrieved data is written to SRAM 162a via the same data bus. In this way, data from NAND Flash 164a may be written directly to SRAM 162a. And in the SRAM-to-Flash mode, data is read from SRAM 162a via data bus 212 and, at the same time, the retrieved data is written to NAND Flash 164a via the same data bus. In this way, data from SRAM 162a may be written directly to NAND Flash 164a as the SRAM is accessed. The Flash-to-SRAM and SRAM-to-Flash modes support fast data swapping between SRAM 162a and NAND Flash 164a, and are described in further detail below.

In an embodiment, the read and write operations for SRAM 162a and NAND Flash 164a are controlled by EMI unit 150 based on commands received from main controller 130, DSP 180, or some other processing unit. By having the read and write operations of the external storage units handled by EMI unit 150 without involvement by the requesting unit (e.g., main controller 130), system performance may be improved since the requesting unit is now free to perform other tasks instead of having to supervise the external memory access operations.

Figure 3:
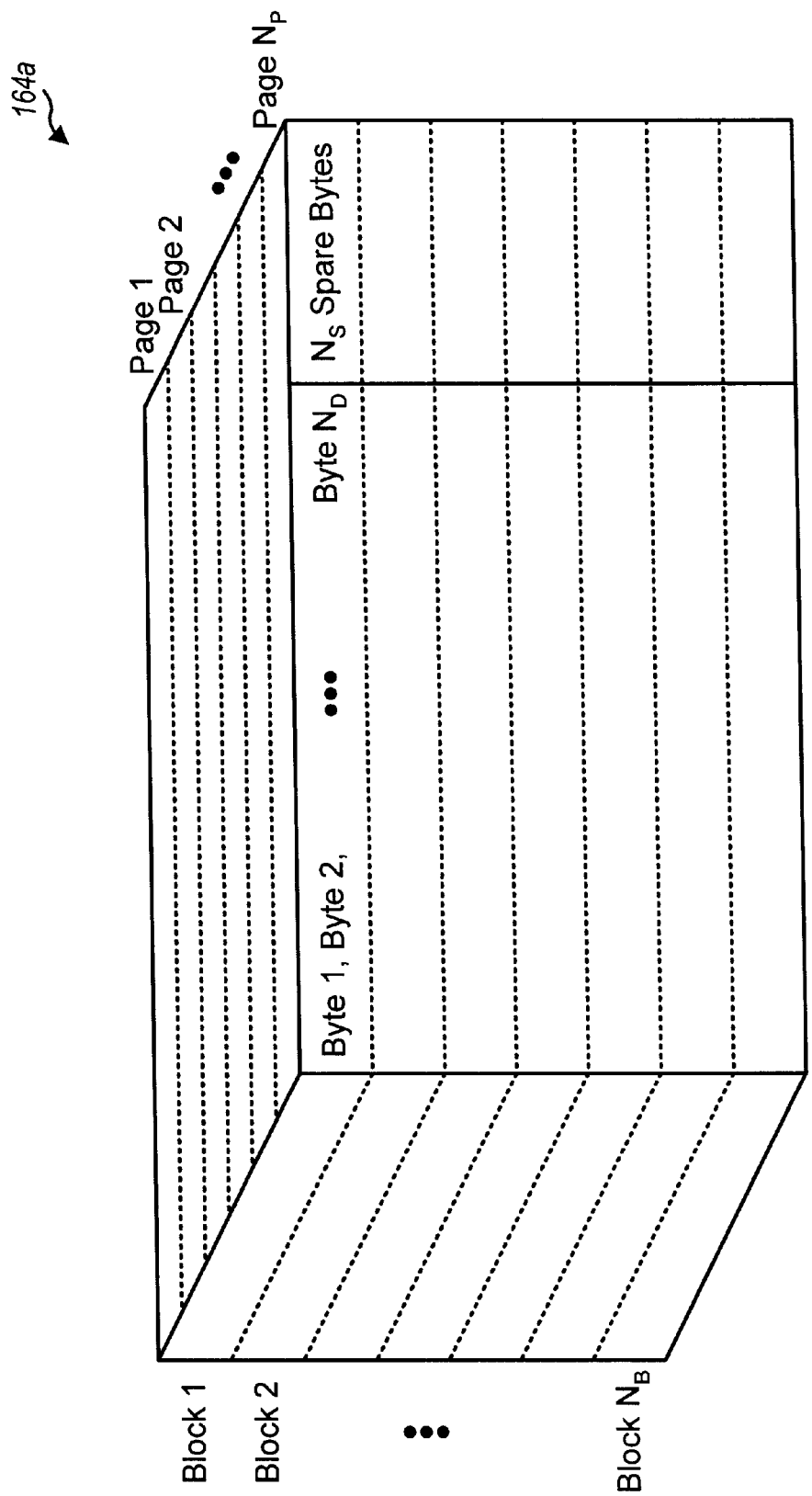
FIG. 3 is a diagram that graphically illustrates an example structure of the NAND Flash.

FIG. 3 is a diagram that graphically illustrates an example structure of NAND Flash 164a. NAND Flash 164a is partitioned into $N_B$ equal-size blocks. Each block further includes $N_P$ equal-size pages, and each page includes a data area of $N_D$ bytes plus a spare area of $N_S$ bytes. As a specific example, NAND Flash 164a may include $N_B$=4096 blocks, with each block including $N_P$=32 pages and each page including $N_D$=512 bytes for data and $N_S$=16 spare bytes. This NAND Flash would then have a storage capacity of 512 Mbits or 64 Mbytes. A larger or smaller size NAND Flash may also be used within device 100, and this is within the scope of the invention. Typically, certain Flash operations (e.g., write and read) are performed on page units while certain other Flash operations (e.g., erase) are performed on block units.

Error Correction Coding

As noted above, NAND Flash is more susceptible to bit errors over its operating life. In an embodiment, data integrity of the NAND Flash is ensured by performing block coding on each page of data to be written to or read from the NAND Flash. Each page may be defined to be of a particular size (e.g., $N_D$=512 bytes) and is also associated with a respective spare area of a particular size (e.g., $N_S$=16 bytes). This spare area may be used to store error correction information for the page of data.

Referring back to FIG. 2A, for a Flash write operation (e.g., when operating in the SRAM-to-Flash mode), as each byte of data for a particular page is written to NAND Flash 164a via data bus 212, ECC unit 224 also receives the data byte from the data bus and uses the data byte to generate an ECC value in accordance with a particular block code selected for use. After all $N_D$ data bytes of the page have been written to NAND Flash 164a, the ECC value generated by ECC unit 224 is then written to the spare area for the page. In this way, each page of data in NAND Flash 164a is associated with a respective ECC value that may thereafter be used to detect and correct for bytes of error in the page. For each page, a particular maximum number of error bytes may be corrected based on the associated ECC value, with the maximum number being determined by the error correcting capability of the selected block code.

For a Flash read operation (e.g., when operating in the Flash-to-SRAM mode), as each data byte for a particular page is read from NAND Flash 164a via data bus 212, ECC unit 224 also receives the data byte from the data bus and uses the data byte to generate an ECC value in accordance with the selected block code. After all $N_D$ data bytes of the page have been read from NAND Flash 164a, the ECC value stored in the spare area for the page is then read. The ECC value retrieved for the page is then compared to the newly generated ECC value. Based on the results of the comparison, ECC unit 224 is able to determine whether or not there are any errors in the data page retrieved from NAND Flash 164a. The retrieved ECC value may also be used to determine the location of each error byte and to correct each error byte (up to the maximum number).

Various block codes may be used for error correction coding of Flash data, such as Hamming code, Reed-Solomon code, BCH (Bose, Chaudhuri, and Hocquenghem) code, or some other code. In general, systematic block codes provide ease of use since each block-coded page comprises the original and unmodified data (i.e., the systematic portion) followed by parity data (i.e., the parity portion). The parity data is the ECC value generated from the data portion. Thus, each systematic block-coded page includes $N_P$ data bytes followed by $N_S$ parity bytes. In this way, the data for the page may be written to or read from the NAND Flash followed immediately by the parity data, and temporary storage is not needed for either the systematic or parity portion. In a specific embodiment, a Hamming code is used for error correction coding of Flash data.

Block coding is described in detail in numerous references available in the art. One such reference is a book by S. Lin and D. Costello, entitled "Error Control Coding: Fundamentals and Applications," Prentice Hall, 1983, which is incorporated herein by reference.

Flash-to-SRAM Operation

Figure 4:
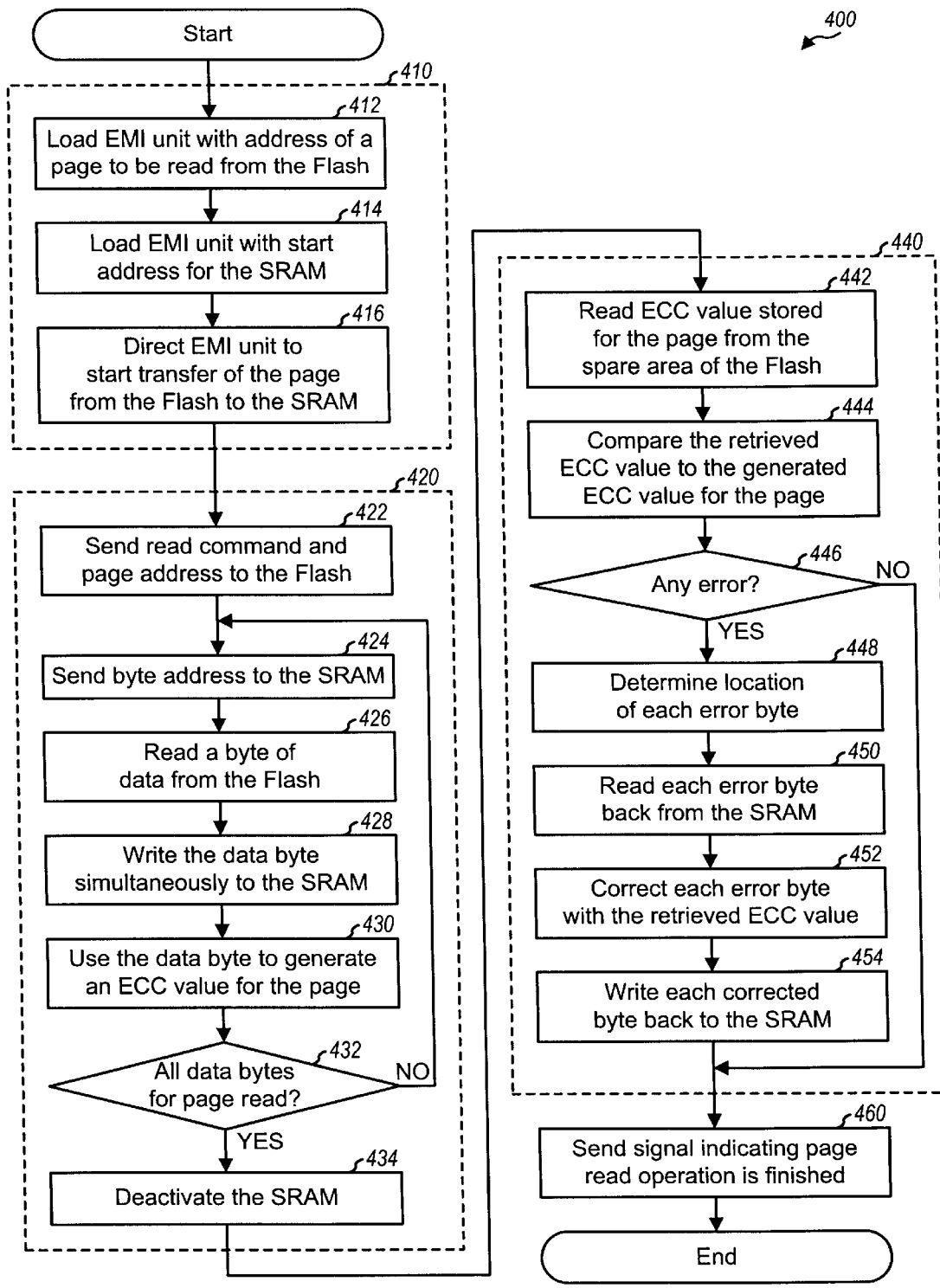
FIGS. 4 and 5 are flow diagrams of an embodiment of two processes for transferring a page of data from the NAND Flash to the SRAM (Flash-to-SRAM) and from the SRAM to the NAND Flash (SRAM-to-Flash), respectively.

FIG. 4 is a flow diagram of an embodiment of a process 400 for transferring a page of data from the NAND Flash to the SRAM. Initially, the DMS controller within the EMI unit is loaded with the address of a specific page to be read from the NAND Flash (step 412). The address generator or the DMS controller is also loaded with the start address of an area in the SRAM where the page of data is to be written (step 414). The DMS controller then receives a command to start the transfer of the page from the NAND Flash to the SRAM (step 416). The page address for the NAND Flash, the start address for the SRAM, and the start command may be provided by the main controller or some other processing unit (e.g., the DSP). Steps 412, 414, and 416 within block 410 are setup steps that may be sufficient to effectuate the entire Flash-to-SRAM page transfer operation. In this way, the unit requesting the data transfer may thereafter be free to perform other tasks instead of having to supervise the actual data transfer.

Figure 6:
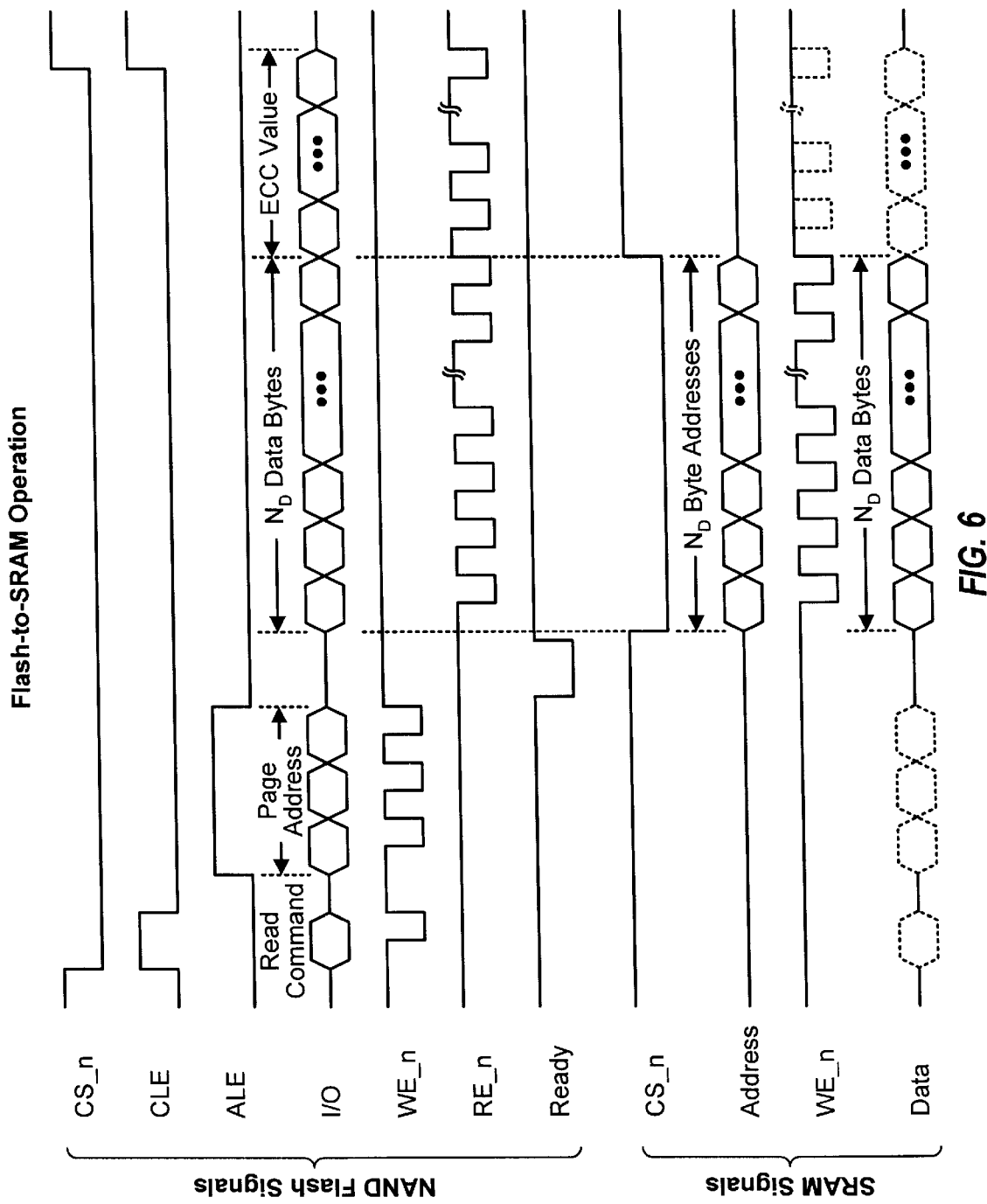
FIGS. 6 and 7 are timing diagrams illustrating the various signals used for, respectively, the Flash-to-SRAM and SRAM-to-Flash page transfer operations.

FIG. 6 is a timing diagram illustrating the various signals used to transfer a page of data from the NAND Flash to the SRAM. The upper half of FIG. 6 shows the signals for the NAND Flash, and the lower half shows the signals for the SRAM. These signals are briefly described above. The Flash-to-SRAM page transfer operation is now described with reference to both FIGS. 4 and 6.

To read the selected page of data from the NAND Flash (block 420), the NAND Flash is first activated (by bringing CS_n for the NAND Flash to logic low) and a read command is sent to the NAND Flash (by bringing CLE to logic high and providing the read command via the data bus to the I/O port of the NAND Flash) (step 422). The page address is then sent to the NAND Flash (by bringing ALE to logic high and providing the page address via the data bus to the I/O port) (also step 422). The page address is provided in multiple bytes, with the specific number of address bytes being determined by the size and partitioning of the NAND Flash. Upon receiving an indication from the NAND Flash that it is no longer busy (when Ready is brought to logic high), the SRAM is activated (by bringing CS_n for the SRAM to logic low) and the actual transfer of the selected page can commence.

For each of the $N_D$ bytes of data for the selected page, the address where the data byte is to be stored in the SRAM is provided by the EMI unit via the address bus to the SRAM (step 424). This byte address may be generated by the address generator within the EMI unit based on the SRAM start address. The next data byte is then read from the NAND Flash via the data bus (at or after the trailing edge of the RE_n signal provided to the NAND Flash (step 426). Simultaneously, the data byte is written via the same data bus to the SRAM at the specified address (step 428).

The data byte is also received by the ECC unit within the EMI unit and used to generate an ECC value for the page (step 430). As each new data byte is received, the ECC value is updated based on the block code selected for use.

A determination is then made whether or not all $N_D$ data bytes for the page have been read from the NAND Flash (step 432). If the answer is no, then the process returns to step 424 to read and transfer another data byte. Otherwise, if all data bytes for the page have been read, then the SRAM is deactivated (by bringing CS_n for the SRAM to logic high) and the ECC value generated for the page is temporarily stored within the ECC unit (step 434). The steps within block 420 perform the actual transfer of the selected page of data from the NAND Flash to the SRAM.

The ECC value stored in the spare area of the NAND Flash for the selected page is also read and temporarily stored in the ECC unit (step 442). After the entire ECC value has been retrieved, the retrieved ECC value is compared to the generated ECC value (step 444). A determination is then made whether or not there are any errors in the page of data just retrieved (step 446). If the retrieved ECC value is equal to the generated ECC value, indicating no errors, then the process proceeds to step 460. Otherwise, error correction is performed on the error bytes, if possible, starting at step 448.

To perform error correction, the location of each error byte is initially determined based on the retrieved ECC value and the structure and characteristics of the selected block code (step 448). Each error byte is then retrieved from the SRAM (step 450, not shown in FIG. 6 for simplicity). This may be achieved by activating the SRAM (by bring CS_n for the SRAM to logic low), providing the address of the error byte on the address bus, and commanding the SRAM for a read operation. The error byte retrieved from the SRAM is then corrected based on the retrieved ECC value (step 452). The corrected byte is then stored back to the SRAM at the same location where it was retrieved (step 454). To expedite the error correction process, all error bytes may be retrieved from the SRAM via one read operation, corrected by the ECC unit, and all corrected bytes may be stored back to the SRAM via one write operation. The steps within block 440 perform the error correction for the page.

If the number of error bytes is greater than the error correcting capability of the selected block code, then an error message may be provided by the EMI unit to warn of the condition. The error correcting capability is determined by the specific block code selected for use.

In one specific error correcting coding design, for a NAND flash with a page size of 512 bytes plus 16 spare bytes for each page, the 512 bytes for a given page is divided into four fully independent sets, with each set including 128 bytes. A Hamming code is used to encode the 128 bytes in each set, which generates 20 bits of coding overhead for each set. The total coding overhead for each page is then 80 bits, and these 80 overhead bits can be saved in the 16 spare byte area of the page. The error correcting capability for this coding scheme may be determined as: (1) can correct one bit error in each set, (2) can detect two or more bit errors in each set, and (3) can correct up to four bit errors in each page. The above represents a specific_error correcting coding design, and other designs may also be implemented and are within the scope of the invention.

Upon completion of the error correction, or if no error correction is needed for the transferred page, a status signal or an interrupt is provided by the EMI unit to indicate that the Flash-to-SRAM page transfer operation is finished (step 460). The process then terminates.

As shown in FIG. 2A, the I/O port of the NAND Flash and the Data port of the SRAM share a common data bus. Referring to FIG. 6, for the Flash-to-SRAM operation, the read command and the page address are provided by the EMI unit via the data bus to the NAND Flash, and the ECC value is also provided by the NAND Flash via the data bus to the EMI unit. These three pieces of data are extraneous to the SRAM (as represented by the dashed transitions on the SRAM's Data signal in FIG. 6) but do not affect the operation of the SRAM since it is not activated during these times (as indicated by the CS_n for the SRAM being at logic high except during the time of the actual data transfer). Similarly, the extraneous pulses on the WE_n signal for the SRAM (as represented by the dashed pulses) do not effect the SRAM's operation.

To perform a multi-page Flash-to-SRAM transfer, the processing shown in FIGS. 4 and 6 may be repeated multiple times, once for each page to be transferred. In an embodiment, the signal/interrupt indicating the completion of the multi-page Flash-to-SRAM transfer is provided by the EMI unit only after all pages have been transferred.

SRAM-to-Flash Operation

Figure 5:
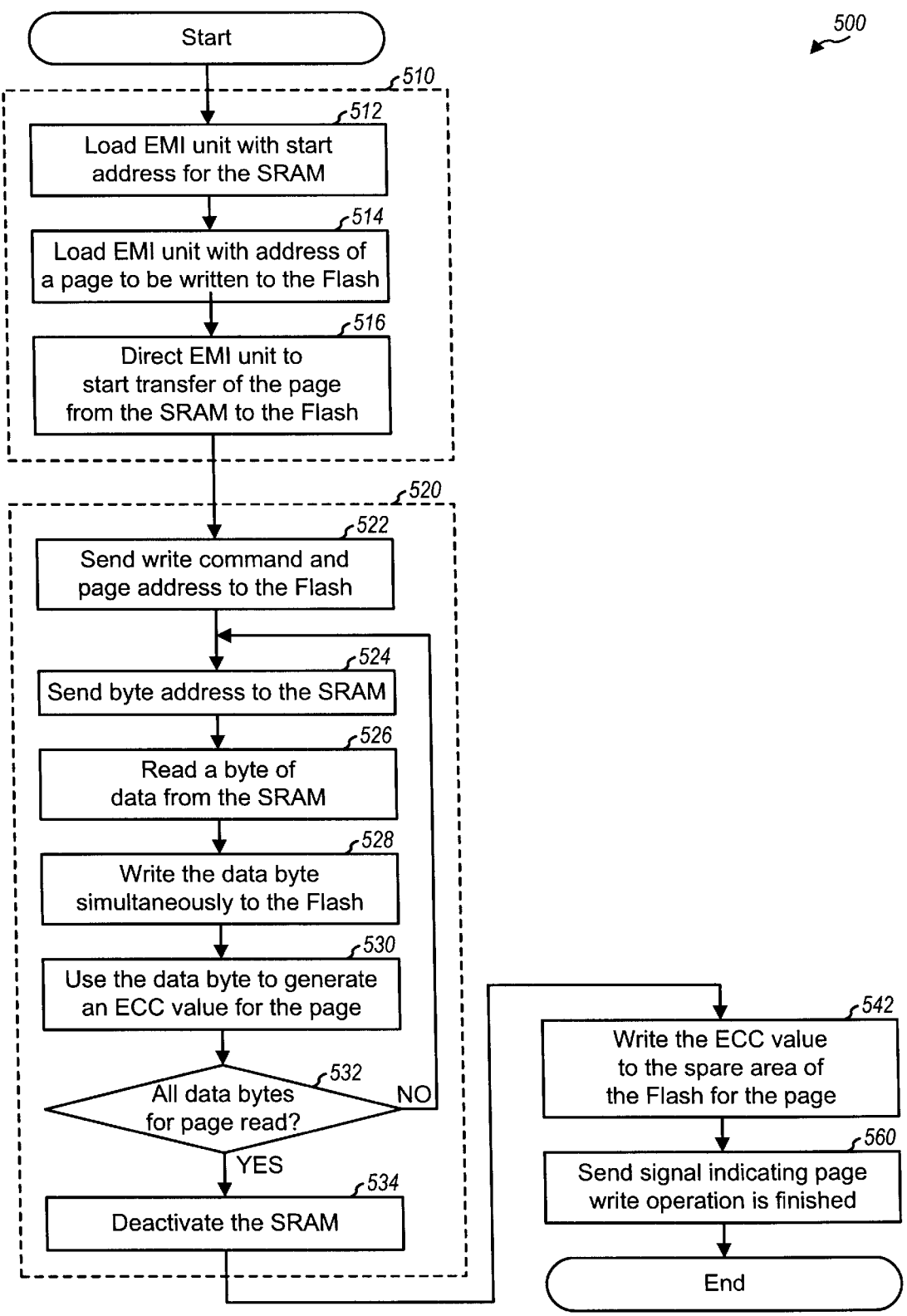

FIG. 5 is a flow diagram of an embodiment of a process 500 for transferring a page of data from the SRAM to the NAND Flash. Initially, the address generator or the DMS controller is loaded with the start address of a page of data to be retrieved from the SRAM (step 512). The DMS controller is also loaded with a page address for the NAND Flash where the page of data is to be written (step 514). The DMS controller then receives a command to start the transfer of the page from the SRAM to the NAND Flash (step 516). Again, the start address for the SRAM, the page address for the NAND Flash, and the start command may be provided by the main controller, the DSP, or some other processing unit. Steps 512, 514, and 516 in block 510 are setup steps that may be sufficient to effectuate the entire SRAM-to-Flash page transfer operation.

Figure 7:
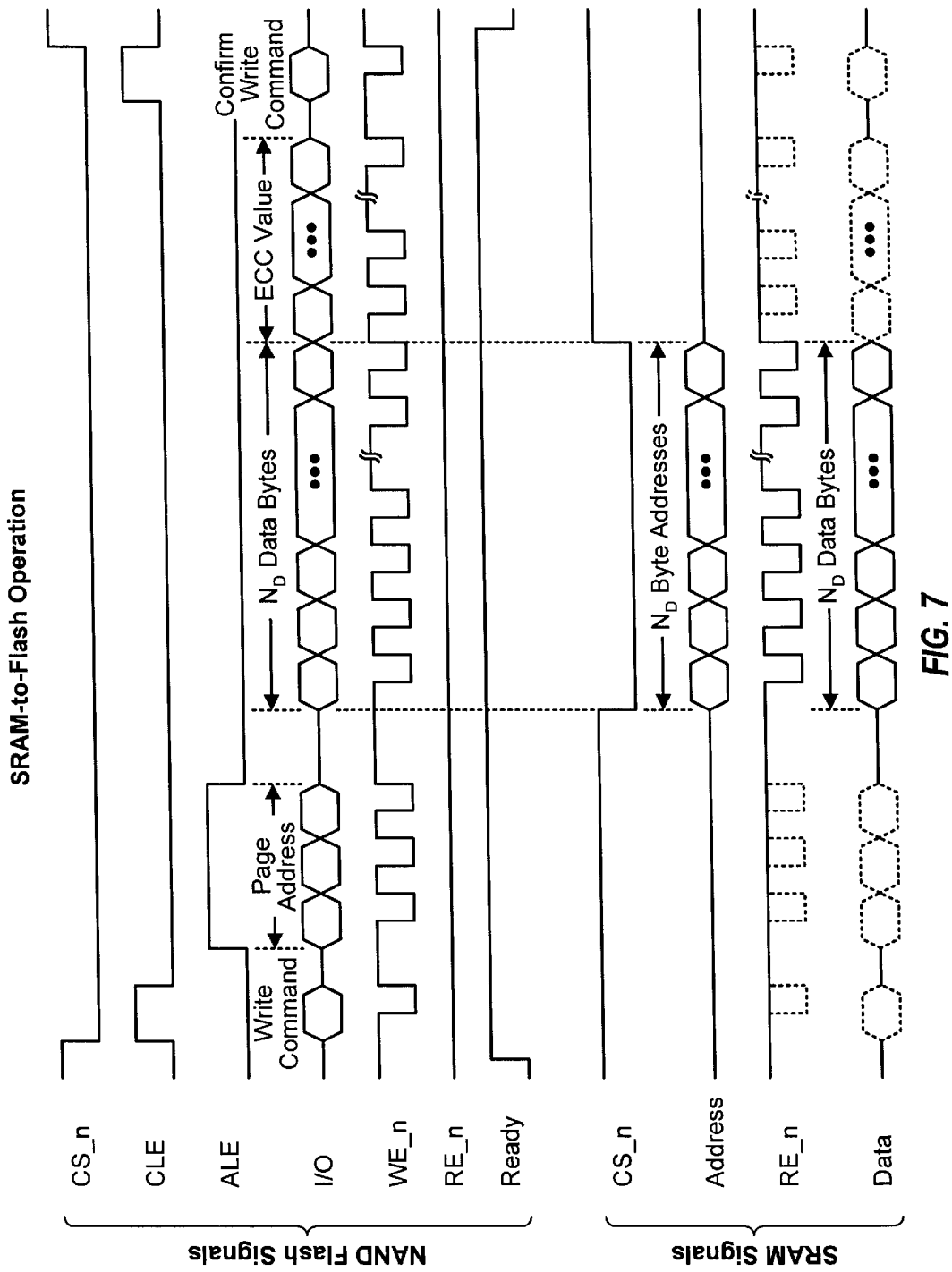

FIG. 7 is a timing diagram illustrating the various signals used to transfer a page of data from the SRAM to the NAND Flash. The upper half of FIG. 7 shows the signals for the NAND Flash, and the lower half shows the signals for the SRAM. The SRAM-to-Flash page transfer operation is now described with reference to both FIGS. 5 and 7.

To write the selected page of data to the NAND Flash (block 520), the NAND Flash is first activated, an indication is received from the NAND Flash that it is not busy, and a write command is sent to the NAND Flash. The page address is then sent to the NAND Flash (also step 522). The SRAM is then activated and the actual transfer of the selected page can commence.

For each of the $N_D$ bytes of data for the selected page, the address where the data byte is to be retrieved from the SRAM is provided via the address bus to the SRAM (step 524). The data byte at the specified address is then read from the SRAM via the data bus (step 526). Simultaneously, the data byte is written via the same data bus to the NAND Flash (step 528).

The data byte is also received by the ECC unit and used to generate an ECC value for the page (step 530). As each new data byte is received, the ECC value is updated based on the selected block code.

A determination is then made whether or not all $N_D$ data bytes for the page have been read from the SRAM (step 532). If the answer is no, then the process returns to step 524 to read and transfer another data byte. Otherwise, if all data bytes for the page have been read, then the SRAM is deactivated (step 534). The ECC value generated for the page is then written to the associated spare area in the NAND Flash (step 542). The steps within block 520 perform the actual transfer of the selected page from the SRAM to the NAND Flash.

Upon completion of the data transfer, a status signal or an interrupt is provided by the EMI unit to indicate that the SRAM-to-Flash page transfer operation is finished (step 560). The process then terminates.

As shown in FIG. 7, for the SRAM-to-Flash operation, the write command, the page address, and the ECC value on the data bus are extraneous to the SRAM (as represented by the dashed transitions on the SRAM's Data signal in FIG. 7). However, these three pieces of data do not affect the operation of the SRAM since it is not activated during these times. Similarly, the extraneous pulses on the RE_n signal for the SRAM (again as represented by the dashed pulses) do not affect the SRAM's operation.

To perform a multi-page SRAM-to-Flash transfer, the processing shown in FIGS. 5 and 7 may be repeated multiple times, once for each page to be transferred. In an embodiment, the signal/interrupt indicating the completion of the multi-page SRAM-to-Flash transfer is provided by the EMI unit only after all pages have been transferred.

The memory architectures and techniques for performing direct memory swapping between the SRAM and NAND Flash may be used for various applications. Such applications include initial power-up booting of executable codes (from the NAND Flash to the SRAM), downloading and playback of application codes (e.g., codes for audio, video, and other end applications), run-time loading of executable codes (from the NAND Flash to the SRAM), and so on.

The memory architectures described herein reduce the number of signal lines needed to interface with both the SRAM and the NAND Flash. This is achieved by using a common data bus for both the SRAM and the NAND Flash.

This design reduces the number of I/O pins required for ASIC 120 to interface with the SRAM and NAND Flash. As integrated circuit technology moves into deep sub-micron, die size decreases and the cost for I/O pins becomes a larger percentage of the total chip cost. The reduced I/O pin count can reduce cost as well as package size for the ASIC.

For clarity, various aspects and embodiments have been described for a specific design in which the SRAM and NAND Flash are both external to the ASIC. In this case, the SRAM and NAND Flash may be implemented on the same or separate integrated circuits. However, the memory architectures and techniques described herein may also be used in designs whereby the SRAM or the NAND Flash, or both, are implemented on ASIC 120.

Also for clarity, various aspects and embodiments have been described specifically for SRAM and NAND Flash. However, other types of memory may be used for the SRAM and other types of memory may also be used for the NAND Flash, and this is within the scope of the invention. In general, the memory architectures and techniques described herein may be used to support direct memory swapping between any two types of memory.

Moreover, the external memory may include more than two storage units (of two or more different memory technologies). In this case, data from any one of the storage units may be transferred to one or more other storage units by activating the affected storage units and providing the proper control signals.

The techniques described herein may also be applied to external memory transfer between any types of memories (e.g., NAND-to-SRAM, NOR Flash-to-SRAM, SRAM-to-SRAM, and so on) provided that (1) the controller(s) can support access of both memories at the same time, and (2) there are sufficient pins to support the memories used (e.g., the SRAM—SRAM transfer requires more pins than NAND Flash-SRAM transfer since the NAND Flash does not use address pins).

The memory architectures and data transfer techniques described herein may be used for wireless communication devices and various other electronics devices and systems. For example, these memory architectures and techniques may be implemented in base stations of a wireless communication system, a computer system, other portable devices, consumer electronics, and so on.

The memory architectures and techniques described herein for direct memory swapping between two types of memory may be implemented by various means. For example, the elements or units used to implement the memory architectures and techniques described herein may be implemented within one or more application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, other electronic units designed to perform the functions described herein, or a combination thereof.

Headings are included herein for reference and to aid in locating certain sections. These headings are not intended to limit the scope of the concepts described therein under, and these concepts may have applicability in other sections throughout the entire specification.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A memory system for a wireless communication device comprising:

a static random access memory (SRAM) storage unit operative to provide storage of data;

a NAND Flash storage unit operative to provide additional storage of data;

an interface unit implemented within an application specific integrated circuit (ASIC) and operative to provide control signals for the SRAM and NAND Flash storage units; and a data bus coupled to the SRAM and NAND Flash storage units and the interface unit, wherein the SRAM and NAND Flash storage units are implemented external to the ASIC, and wherein each storage unit is operable to concurrently store data from the other storage unit via the data bus when the other unit is accessed by the interface unit;

the interface unit being operable to receive a page address for the NAND Flash storage unit and a start address for the SRAM storage unit for a data transfer between the SRAM and NAND Flash storage units, and operative to provide the control signals for the SRAM and NAND Flash storage units to effectuate the data transfer in response to receiving a start command.

2. A memory system for a wireless communication device, comprising:

a static random access memory (SRAM) storage unit operative to provide storage of data;

a NAND Flash storage unit operative to provide additional storage of data;

an interface unit implemented within an application specific integrated circuit (ASIC) and operative to provide control signals for the SRAM NAND Flash storage units; and a data bus coupled to the SRAM and NAND Flash storage units and the interface unit, wherein the SRAM and NANT) flash storage units are implemented external to the ASIC, and wherein each storage unit is operable to concurrently store data from the other storage unit via the data bus when the other storage unit is accessed by the interface unit;

wherein n write enable control for the SRAM is coupled to a read enable control for the NAND Flash, and wherein the write enable control for the NAND Flash is coupled to the read enable control for the SRAM.

3. The memory system of claims 1 or 2, wherein the interface unit includes an error correction coding (ECC) unit operative to perform block coding of data transferred to or from the NAND Flash storage unit.

4. The memory system of claim 3, wherein the ECC unit is operative to perform block coding of data based on a Hamming code.

5. The memory system of claim 1 or 2 wherein the interface unit includes an address generator operative to provide addresses for data transferred to or from the SRAM storage unit.

6. The memory system of claim 2, wherein the interface unit is operable to receive page address for the NAN) Flash storage unit a start address fir the SRAM storage unit for a data transfer between the SRAM an NAND Flash storage units.

7. The memory system of claim 1 or 2, wherein the wireless communication device is a terminal in a wireless communication system.

8. The memory system of claims 1 or 2, wherein the wireless communication device is a cellular phone in a wireless communication system.

9. A method for transferring data between to storage units in a wireless communication device comprising:
   receiving a start address for an SRAM storage unit;
   receiving a page address for a NAND Flash storage unit;
   providing control signals for the SRAM and NAND Flash storage units in response to receiving a start command;
   retrieving data from a source storage unit via a data bus, wherein the source storage unit is either the SRAM or NAND Flash storage unit; and
   writing the retrieved data to a destination storage unit via the data bus concurrently with the reading of the data from the source storage unit, wherein the destination storage unit is the other storage unit that is not the source storage unit.

10. The method of claim 9, further comprising:
    generating an error correction code (ECC) value for each page of data transferred to or from the NAND Flash storage unit.

11. The method of claim 10, wherein a page of data is transferred from the NAND Flash storage unit to the SRAM storage unit, the method further comprising:
    retrieving an ECC value stored in the NAND Flash storage unit for the data page retrieved from the NAND Flash; and
    comparing the retrieved ECC value to the generated ECC value for the retrieved data page to determine whether or not there are any errors in the data page.

12. The method of claim 11, further comprising:
    if there are errors in the retrieved data page,
       identifying error bytes in the retrieved data page,
       correcting the error bytes based on the retrieved ECC value, and
       writing the corrected bytes to the SRAM storage unit.

13. A The method of claim 10, wherein a page of data is transferred from the SRAM storage unit to the NAND Flash storage unit, method further comprising:
    writing the ECC value generated for the page to the NAND Flash storage unit.

14. A memory communicatively coupled to a digital signal processing device (DSPD) capable of interpreting digital information to:
    receive a start address for an SRAM storage unit;
    receive a page address for a NAND Flash storage unit;
    receive a start command for a page transfer operation;
    provide control signals for the SRAM and NAND Flash storage units in response to the start command;
    retrieve data from a source storage unit via a data bus, wherein the source storage unit is either the SRAM or NAND Flash storage unit; and
    write the retrieved data to a destination storage unit the data bus concurrently with the reading of the data from the source storage unit, wherein the destination storage unit is the other storage unit that is not the so storage unit.

15. The memory of claim 14, wherein the DSPD further capable of interpreting digital information to:
    generate an error correction code (ECC) value for each page of data transferred to or from the NAND Flash storage unit.

16. The memory of claim 15, wherein a page of data is transferred from the NAND Flash storage unit to the SRAM storage unit, and wherein the DSPD is further capable of interpreting digital information to:
    retrieve an ECC value stored in the NAND Flash storage for the data page retrieved from the NAND Flash; and
    compare the retrieved ECC value to the generated ECC value for the retrieved data page to determine whether not there any error page.

17. The memory of claim 15, wherein the DSPD further capable of interpreting digital information to:
    if there are errors in the retrieved data page,
       identify error bytes in the retrieved data page,
       correct the error bytes based an the retrieved ECC value, and
       write the corrected bytes to the SRAM storage unit.

18. The memory of claim 15, wherein a page of data is transferred from the SRAM storage unit to the NAND Flash storage unit, and wherein the DSPD is further capable of interpreting digital information to:
    write the ECC value generated for the data page to the NAND Flash storage unit.

* * * * *